US012592741B2

(12) United States Patent
Singhal et al.

(10) Patent No.: US 12,592,741 B2
(45) Date of Patent: Mar. 31, 2026

(54) BIAS POINT SELECTION CIRCUITRY FOR IMPROVED LINEARITY

(71) Applicant: Apple Inc., Cupertino, CA (US)

(72) Inventors: Nitesh Singhal, Santa Clara, CA (US);
Mark G Forbes, San Carlos, CA (US);
Abbas Komijani, Mountain View, CA
(US); Jong Seok Park, San Diego, CA
(US); Youngchang Yoon, San Diego,
CA (US); Georgios Palaskas, San
Diego, CA (US)

(73) Assignee: Apple Inc., Cupertino, CA (US)

( * ) Notice: Subject to any disclaimer, the term of this patent is extended or adjusted under 35 U.S.C. 154(b) by 2 days.

(21) Appl. No.: 18/672,960

(22) Filed: May 23, 2024

(65) Prior Publication Data

US 2025/0096836 A1      Mar. 20, 2025

Related U.S. Application Data

(60) Provisional application No. 63/582,800, filed on Sep. 14, 2023.

(51) Int. Cl.
| | |
|---|---|
| *H04B 1/40* | (2015.01) |
| *H03K 17/687* | (2006.01) |
| *H03M 1/66* | (2006.01) |
| *H04B 17/21* | (2015.01) |

(52) U.S. Cl.
CPC ........... *H04B 1/40* (2013.01); *H03K 17/6871* (2013.01); *H03M 1/66* (2013.01); *H04B 17/221* (2023.05)

(58) Field of Classification Search
CPC ..... H04B 1/40; H04B 17/221; H03K 17/6871

USPC .......................................................... 375/316
See application file for complete search history.

(56) References Cited

U.S. PATENT DOCUMENTS

| | | | |
|---|---|---|---|
| 7,139,196 | B2 | 11/2006 | Tran |
| 9,584,085 | B2 | 2/2017 | Scott et al. |
| 9,864,000 | B2 | 1/2018 | Nobbe et al. |
| 11,233,482 | B2 | 1/2022 | Al-Shyoukh |
| 11,550,041 | B2 | 1/2023 | Kashmiri |
| 2013/0158921 | A1* | 6/2013 | Shah ........................ H03F 3/187 |
| | | | 702/65 |

* cited by examiner

*Primary Examiner* — Leila Malek
(74) *Attorney, Agent, or Firm* — Treyz Law Group; Jason Tsai

(57) ABSTRACT

Wireless circuitry is provided that includes a radio-frequency circuit having an input transistor and bias point selection circuitry configured to determine an optimal bias voltage for the input transistor. The bias point selection circuitry may include a replica transistor, a voltage generator configured to output one or more voltage levels to a gate terminal of the replica transistor, a current-to-voltage converter coupled to a source-drain terminal of the replica transistor, an analog-to-digital converter configured to receive analog voltages from the current-to-voltage converter and to output corresponding digital codes based on the received analog voltages, and associated control circuitry configured to receive the digital codes from the analog-to-digital converter and to adjust the voltage generator to output the optimal bias voltage based on the digital codes. The optimal bias voltage produces a third order transconductance of zero for the input transistor, which results in improved linearity for the radio-frequency circuit.

20 Claims, 12 Drawing Sheets

Example Gm3 Interpolators/Polynomials with N=4

| Current Samples | Iout(Vout-3ΔV) | Iout(Vout-2ΔV) | Iout(Vout-ΔV) | Iout(Vout) | Iout(Vout+ΔV) | Iout(Vout+2ΔV) | Iout(Vout+3ΔV) |
|---|---|---|---|---|---|---|---|
| Coefficients of 2:1 Interpolator | 0 | -1/2 | 2/2 | 0 | -2/2 | 1/2 | 0 |
| Coefficients of 3:1 Interpolator | -1/8 | 0 | 3/8 | 0 | -3/8 | 0 | 1/8 |
| Coefficients of 3:2 Interpolator | -2/10 | 3/10 | 0 | 0 | 0 | -3/10 | 2/10 |

OUTPUT N VOLTAGES TO REPLICA TRANSISTOR ~200

OBTAIN N CORRESPONDING DIGITAL CODES ~202

DETERMINE RESISTOR DAC CODE THAT
PRODUCES A Gm3 OF ZERO ~204

BIAS INPUT TRANSISTOR IN RF CIRCUIT
USING Vout CORRESPONDING TO RESISTOR
DAC CODE THAT PRODUCES A Gm3 OF ZERO ~206

BIAS POINT SELECTION CIRCUITRY FOR IMPROVED LINEARITY

This application claims the benefit of U.S. Provisional Patent Application No. 63/582,800, filed Sep. 14, 2023, which is hereby incorporated by reference herein in its entirety.

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

The wireless circuitry can include amplifiers, mixers, and other transmitting and receiving circuits that need to be biased for optimal performance. It can be challenging to determine the optimal bias point for wireless circuitry that is subject to process, voltage, and temperature (PVT) variations.

SUMMARY

An electronic device may include wireless communications circuitry. The wireless communications circuitry may include one or more processors or signal processing blocks for generating baseband signals, a transceiver for upconverting (modulating) the baseband signals to radio frequencies and for downconverting (demodulating) radio-frequency signals to baseband signals, a radio-frequency power amplifier for amplifying radio-frequency signals prior to transmission at one or more antennas, and a radio-frequency low noise amplifier for amplifying radio-frequency signals received at one or more antennas in the electronic device. Any component disposed along the transmit path and/or the receive path of the wireless circuitry can be referred to as a radio-frequency circuit.

An aspect of the disclosure provides wireless circuitry that includes a radio-frequency circuit having an input transistor and bias point selection circuitry configured to output a bias voltage for biasing a gate terminal of the input transistor. The bias point selection circuitry can include a replica transistor that is a replica of the input transistor, a voltage generator configured to output one or more voltage levels to a gate terminal of the replica transistor, and a current-to-voltage converter coupled to a source-drain terminal of the replica transistor. The bias point selection circuitry can further include an analog-to-digital converter configured to receive analog voltages from the current-to-voltage converter and to output corresponding digital codes based on the received analog voltages. The wireless circuitry can further include control circuitry configured to receive the digital codes from the analog-to-digital converter, to adjust the voltage generator to output the bias voltage based on the digital codes, and to determine the bias voltage by performing interpolation operations on the digital codes. The voltage generator can include a current source, a chain of resistors coupled in series with the current source, a resistive digital-to-analog converter (DAC) coupled in series with the current source and tuned by the control circuitry, and a plurality of switches coupled between the chain of resistors and the gate of the replica transistor.

An aspect of the disclosure provides a method of determining a bias voltage for an input transistor in wireless circuitry, the method including: sequentially outputting, with a voltage generator, a plurality of different voltages to a replica transistor that is a replica of the input transistor; converting, with a current-to-voltage converter, different current levels flowing through the replica transistor when the plurality of different voltages are provided to the replica transistor into corresponding analog voltages; and converting, with an analog-to-digital converter, the analog voltages into corresponding digital codes. The method can further include performing interpolation operations on the digital codes to determine the bias voltage and determining a setting for the voltage generator that produces a third order transconductance equal to zero for the replica transistor.

An aspect of the disclosure provides circuitry that includes a radio-frequency circuit having an input transistor and bias voltage determination circuitry configured to determine a bias voltage for the input transistor that produces a third order transconductance of zero for the input transistor. The bias voltage determination circuitry can include a replica transistor having identical physical properties as the input transistor, a voltage generator coupled to a gate terminal of the replica transistor, and a current-to-voltage converter coupled to a source-drain terminal of the replica transistor. The radio-frequency circuit can be a radio-frequency amplifier, a variable gain amplifier, a mixer, and/or other active or passive radio-frequency component. The bias voltage determination circuitry can further include an analog-to-digital converter configured to receive analog voltages from the current-to-voltage converter and to generate corresponding digital codes and a bias point control circuit configured to receive the digital codes from the analog-to-digital converter and to identify a setting for the voltage generator that produces the bias voltage for the input transistor by performing interpolation operations on the digital codes. The voltage generator can include a first pair of switches that are selectively activated to allow current to flow through the voltage generator in a first direction and a second pair of switches that are selectively activated to allow current to flow through the voltage generator in a second direction that is reversed with respect to the first direction.

BRIEF DESCRIPTION OF THE DRAWINGS

FIG. 6B is a table showing illustrative coefficients for different types of interpolators in accordance with some embodiments.

DETAILED DESCRIPTION

Figure 1:
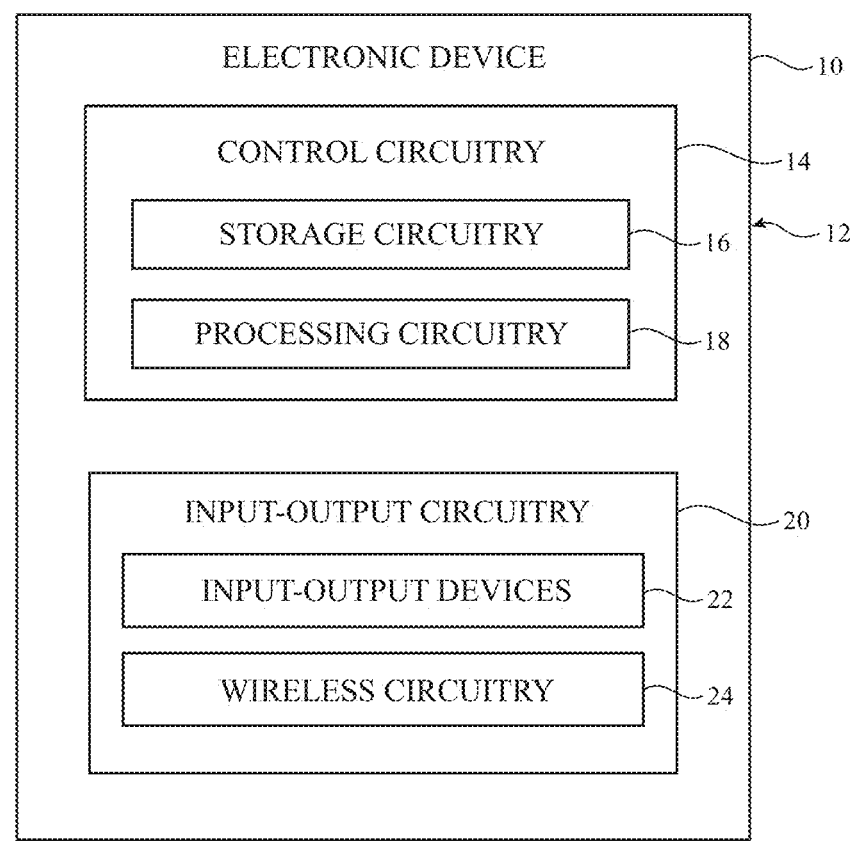
FIG. 1 is a diagram of an illustrative electronic device having wireless circuitry in accordance with some embodiments.

An electronic device such as device 10 of FIG. 1 may be provided with wireless circuitry. Wireless circuitry can include radio-frequency circuits such as one or more radio-frequency amplifiers, variable gain amplifiers, mixers, phase-locked loops, radio-frequency switches, radio-frequency filters, impedance matching networks, voltage-controlled oscillators, voltage-controlled attenuators, frequency dividers, and/or other electronic components in the transmit or receive path. For example, a radio-frequency (RF) circuit such as an RF amplifier can include an input transistor with a transconductance such as a $3^{rd}$ order transconductance (Gm3) that impacts the linearity of the amplifier. In accordance with an embodiment, the wireless circuitry can be provided with bias point selection circuitry configured to determine an optimum bias voltage for biasing the input transistor in the amplifier to produce a Gm3 that maximizes the linearity of the amplifier. For instance, the bias point selection circuitry can identify a bias point that ensures Gm3 is equal to zero.

The bias point selection circuitry may include a replica transistor (e.g., a replica of the input transistor in the RF circuit being optimized), a voltage generator for selectively outputting different voltage levels to the gate of the replica transistor, a current-to-voltage generator for converting a current flowing through the replica transistor to a corresponding analog voltage, and an analog-to-digital converter (ADC) for converting the analog voltage to a digital code. During calibration operations, the bias point selection circuitry can be configured to obtain various digital codes corresponding to the different voltage levels output from the voltage generator, to search for a voltage level output by the voltage generator that yields Gm3 of zero, and to use such identified voltage level to bias the input transistor in the RF circuit. Configuring and operating radio-frequency circuits in this way can be technically advantageous and beneficial by improving linearity (e.g., by improving the error vector magnitude) over process, voltage, and temperature (PVT) variations.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols-sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
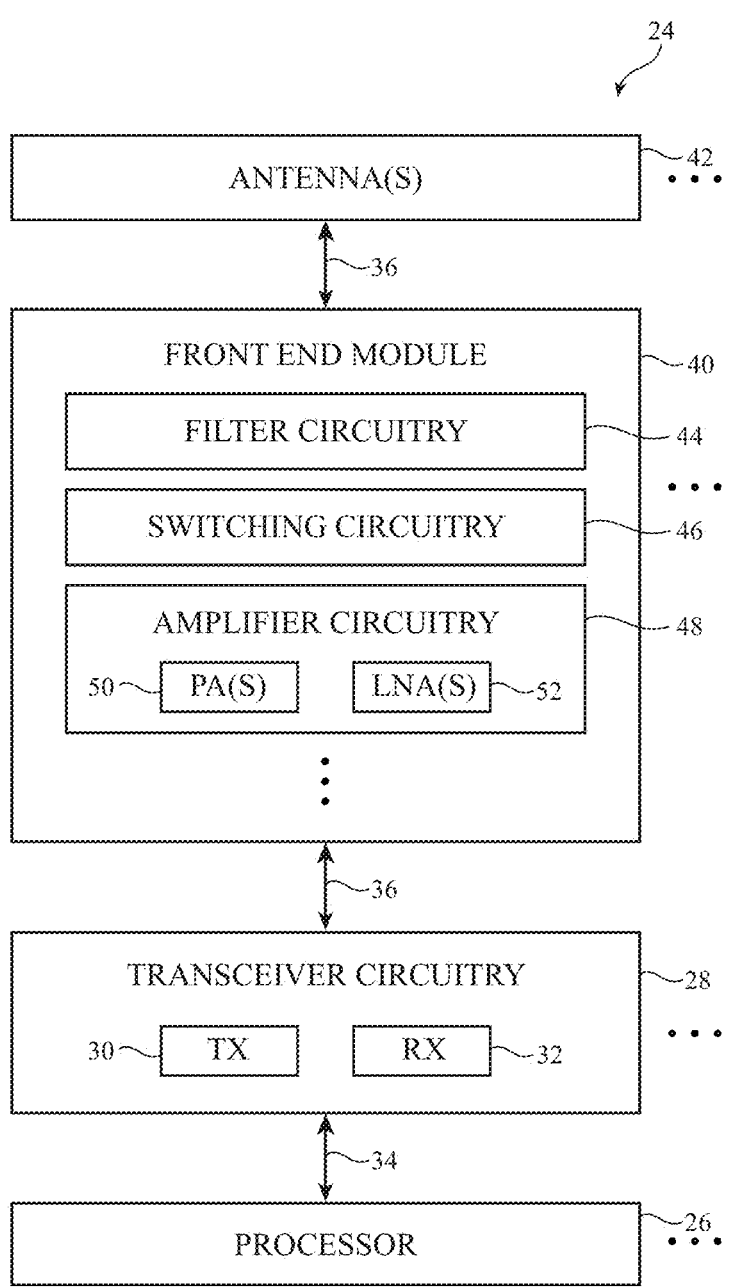
FIG. 2 is a diagram of illustrative wireless circuitry having transceiver and amplifier circuits in accordance with some embodiments.

FIG. 2 is a diagram showing illustrative components within wireless circuitry 24. As shown in FIG. 2, wireless circuitry 24 may include a processor such as processor 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, application processor, general purpose processor, microprocessor, microcontroller, digital signal processor, host processor, application specific signal processing hardware, or other type of processor. Processor 26 may be coupled to transceiver 28 over path 34. Transceiver 28 may be coupled to antenna 42 via radio-frequency transmission line path 36. Radio-frequency front end module 40 may be disposed on radio-frequency transmission line path 36 between transceiver 28 and antenna 42.

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

In performing wireless transmission, processor 26 may provide transmit signals (e.g., digital or baseband signals) to transceiver 28 over path 34. Transceiver 28 may further include circuitry for converting the transmit (baseband) signals received from processor 26 into corresponding radio-frequency signals. For example, transceiver circuitry 28 may include mixer circuitry for up-converting (or modulating) the transmit (baseband) signals to radio frequencies prior to transmission over antenna 42. The example of FIG. 2 in which processor 26 communicates with transceiver 28 is merely illustrative. In general, transceiver 28 may communicate with a baseband processor, an application processor, general purpose processor, a microcontroller, a microprocessor, or one or more processors within circuitry 18. Transceiver circuitry 28 may also include digital-to-analog converter (DAC) and/or analog-to-digital converter (ADC) circuitry for converting signals between digital and analog domains. Transceiver 28 may use transmitter (TX) 30 to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry such as receiver (RX) 32 for receiving signals from front end module 40 and for converting the received radio-frequency signals into corresponding baseband signals. For example, transceiver 28 may include mixer circuitry for down-converting (or demodulating) the received radio-frequency signals to baseband frequencies prior to conveying the received signals to processor 26 over path 34.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits 50 and/or one or more low-noise amplifier circuits 52), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip. If desired, amplifier circuitry 48 and/or other components in front end 40 such as filter circuitry 44 may also be implemented as part of transceiver circuitry 28.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front end module 40. For example, transceiver 28 may be formed on another substrate such as the main logic board of device 10, a rigid printed circuit board, or flexible printed circuit that is not a part of front end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver 28 (e.g., a host processor on transceiver 28) may form a part of control circuitry 14. Control circuitry 14 (e.g., portions of control circuitry 14 formed on processor 26, portions of control circuitry 14 formed on transceiver 28, and/or portions of control circuitry 14 that are separate from wireless circuitry 24) may provide control signals (e.g., over one or more control paths in device 10) that control the operation of front end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

It can be challenging to design a satisfactory radio-frequency circuit for an electronic device. Radio-frequency circuit can include non-linear devices whose performance is oftentimes degraded due to intermodulation distortion. Intermodulation distortion arises when at least two signals at different frequencies are applied to a non-linear circuit and when the amplitude modulation or mixing (multiplication) of the two signals when their sum is raised to a power greater than one generates intermodulation products that are not just at harmonic frequencies (integer multiples) of either input signal but also at sums and differences of the input signal frequencies and also at sums and differences of multiples of those frequencies. Other undesirable effects of non-linear circuits an include harmonic distortion, gain compression, and desensitization, just to name a few. Third order transconductance, sometimes referred to and defined herein as "Gm3", is a parameter that can be used to describe or quantify the nonlinearity of a device. Third order transconductance Gm3 is a measure of how the output current of a transistor varies in response to a change in the input voltage (e.g., Gm3 is a third order derivative of the output current with respect to the input voltage). Third order non-linearity or Gm3 can cause gain compression and third order intermodulation distortion, sometimes referred to as IM3 or IMD3.

The non-linearity performance of a radio-frequency circuit can be quantified using an output third order intercept point, sometimes referred to and defined herein as "OIP3." The output $3^{rd}$ order intercept point OIP3, as its name suggests, refers to the output power level at which the third order intermodulation products IM3 become equal in power to the desired output signal. In other words, OIP3 quantifies the ability of a radio-frequency circuit to handle multiple input signals without introducing significant distortion or intermodulation (e.g., OIP3 can provide insight into the linearity of a device by revealing how much input power can be applied before intermodulation products start to degrade the signal quality). A higher OIP3 value generally indicates better linearity and greater resistance to intermodulation distortion in complex signal environments with challenging signal conditions.

Figure 3:
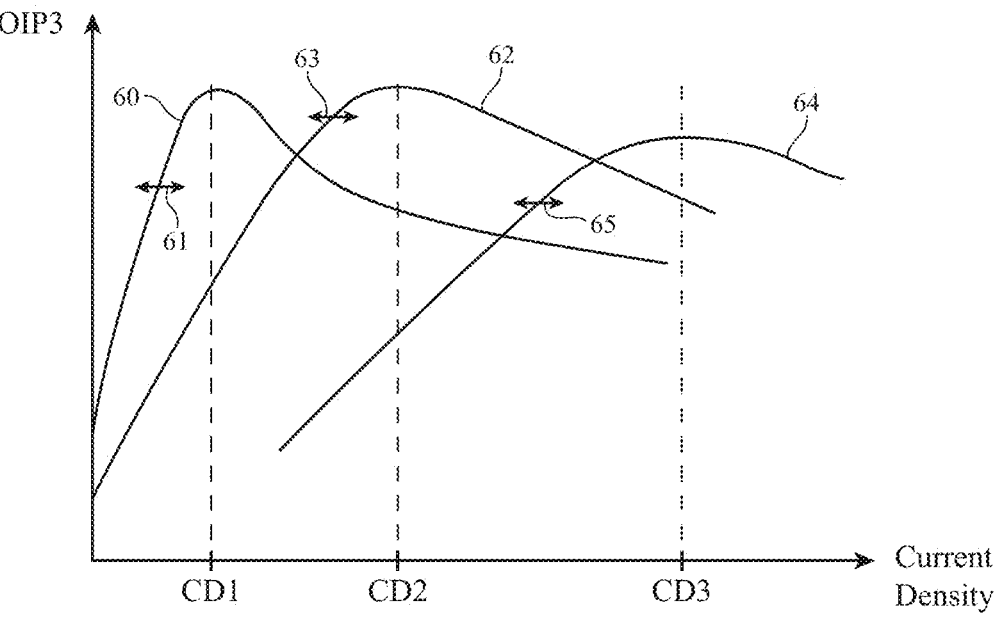
FIG. 3 is a plot of output $3^{rd}$ order intercept point (OIP3) as a function of current density across different process corners in accordance with some embodiments.

FIG. 3 is a plot of output $3^{rd}$ order intercept point (OIP3) as a function of current density across different process corners for manufacturing a given semiconductor device such as a metal-oxide-semiconductor field-effect transistor (MOSFET). Curve 60 represents the OIP3 profile as a function of transistor current density corresponding to a slow process corner. Curve 62 represents the OIP3 profile as a function of transistor current density corresponding to a typical process corner. Curve 64 represents the OIP3 profile as a function of transistor current density corresponding to a fast process corner. It is generally desirable to operate a non-linear device in a region that yields the highest OIP3. As shown in FIG. 3, current density level CD1 may correspond to the optimum current density that produces the maximum OIP3 for the slow process corner; current density level CD2 may correspond to the optimum current density that produces the maximum OIP3 for the typical process corner; and current density level CD3 may correspond to the optimum current density that produces the maximum OIP3 for the fast process corner.

The optimum current density level CD1 for the slow process corner can vary slightly in the x direction when there is temperature variation, as indicated by arrow 61. The optimum current density level CD2 for the typical process corner can vary slightly in the x direction when there is temperature variation, as indicated by arrow 63. The optimum current density level CD3 for the fast process corner can vary slightly in the x direction when there is temperature variation, as indicated by arrow 65. While temperature variation causes only slight deviations in the optimal/target current density levels, FIG. 3 shows how process variations can result in large deviations in the optimal current density needed to produce the highest OIP3. The current density of a transistor can depend on its bias voltage (e.g., a bias voltage that is applied to its gate terminal, sometimes referred to as a gate voltage or a gate-to-source voltage Vgs). For example, if a fixed bias voltage is applied to a MOS transistor, a relatively large degradation of 5 or more dB in OIP3 can result if the current density remains fixed over different process corners.

Figure 4:
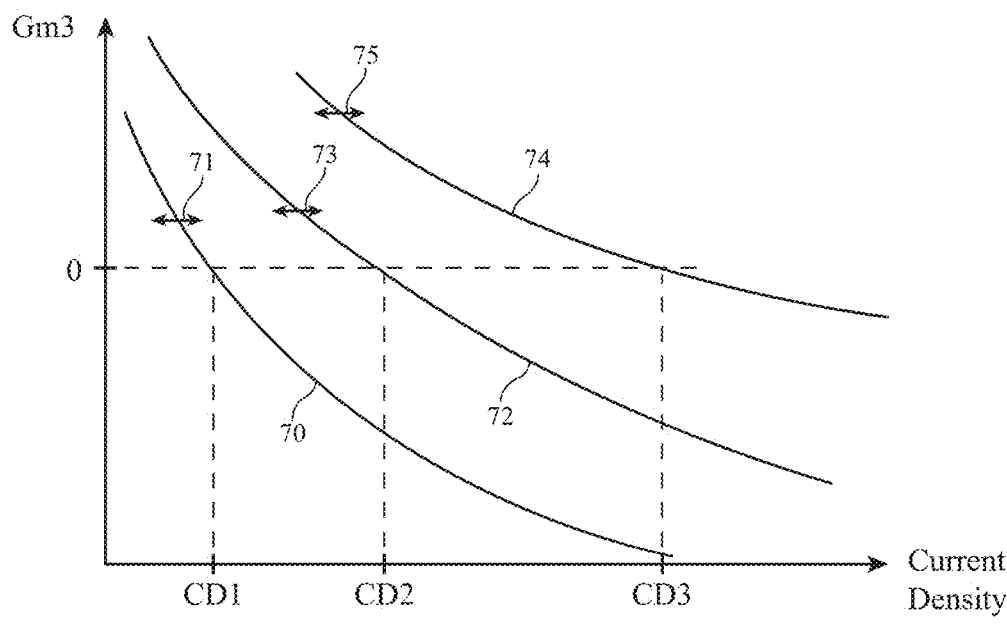
FIG. 4 is a plot of $3^{rd}$ order transconductance (Gm3) as a function of current density across different process corners in accordance with some embodiments.

FIG. 4 is a plot of $3^{rd}$ order transconductance Gm3 as a function of current density across different process corners. Curve 70 represents the Gm3 profile as a function of current density for a slow process corner. Curve 72 represents the Gm3 profile as a function of current density for a typical process corner. Curve 74 represents the Gm3 profile as a function of current density for a fast process corner. Curve 70 can shift slightly in the x direction when there is temperature variation, as indicated by arrow 71. Curve 72 can shift slightly in the x direction when there is temperature variation, as indicated by arrow 73. Curve 74 can shift slightly in the x direction when there is temperature variation, as indicated by arrow 75. As shown in FIG. 4, the optimum current density level that produces the highest OIP3 for each process corner generally corresponds to a Gm3 of zero. Thus, it is recognized herein that the current density at which Gm3 is equal to zero will track the optimal OIP3 over different process corners.

Figure 5:
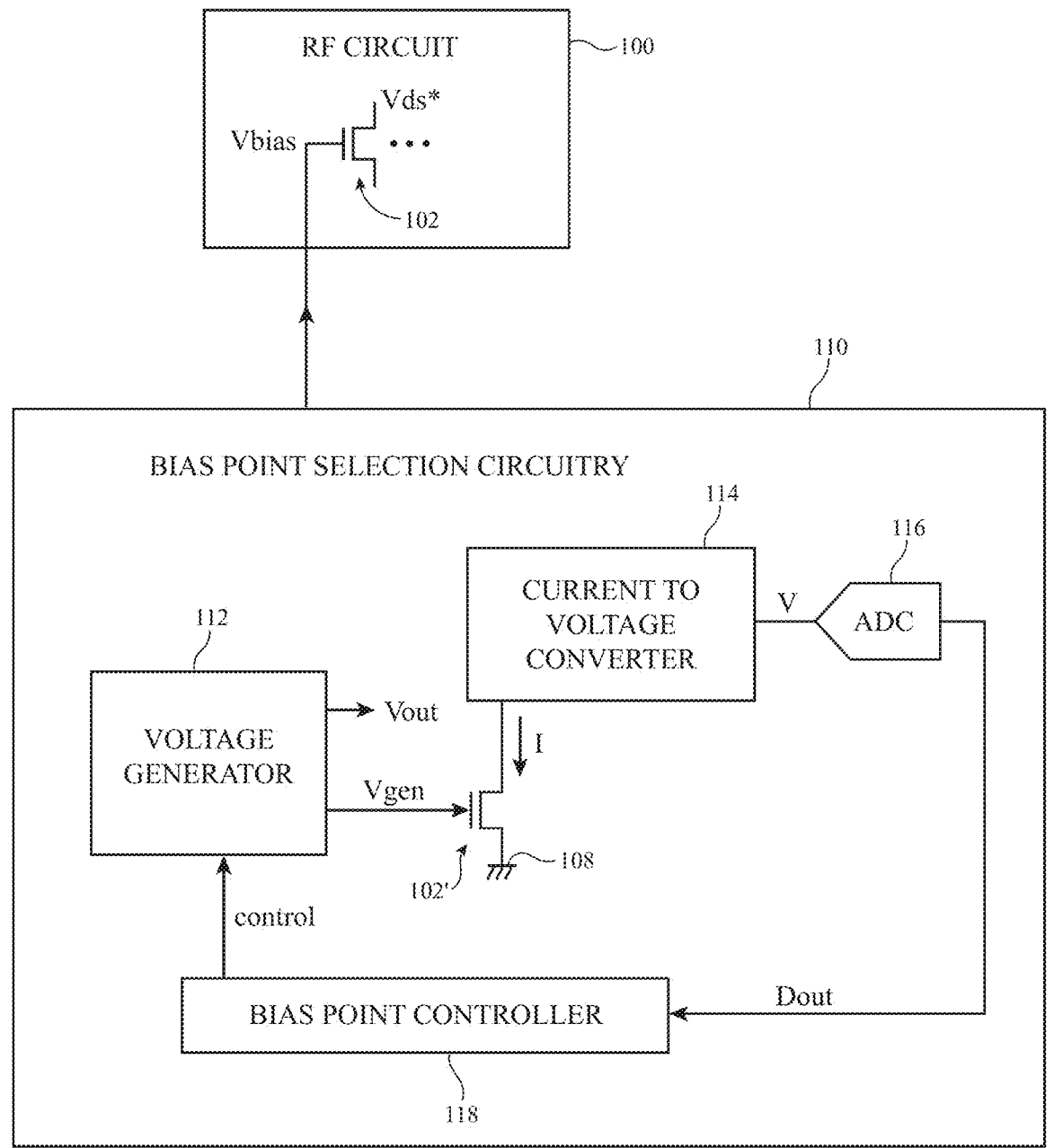
FIG. 5 is a diagram of illustrative bias point selection circuitry configured to determine an optimum bias voltage for a radio-frequency circuit in accordance with some embodiments.

FIG. 5 is a diagram of illustrative bias point selection circuitry such as bias point selection circuitry 110 configured to determine an optimum bias voltage for biasing a radio-frequency circuit 100 that will yield a Gm3 of zero. Bias point selection circuitry 110 is sometimes referred to as a bias voltage selection or determination circuitry. Radio-frequency circuit 100 can represent a radio-frequency amplifier, variable gain amplifier, mixer, phase-locked loop, radio-frequency switch, radio-frequency filter, impedance matching network, voltage-controlled oscillator, voltage-controlled attenuator, frequency divider, a component in transceiver circuitry 28 (see FIG. 2), a component in front end module 40, and/or other electronic components in the transmit or receive path of wireless circuitry 24. As shown in FIG. 5, radio-frequency circuit 100 can include, among other transistors, a main transistor such as an input transistor 102 that governs the overall linearity performance of circuit 100. Input transistor 102 may have a gate terminal configured to receive a bias voltage Vbias, a drain terminal, and a source terminal. Bias voltage Vbias that is applied to the gate of transistor 102 is sometimes referred to as a gate voltage. The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal).

Bias point selection circuitry 110 may be configured to output an optimum bias voltage for input transistor 102 of radio-frequency circuit 100. As shown in FIG. 5, bias point selection circuitry 110 can include a replica transistor 102', a voltage generation circuit such as voltage generator 112, a current-to-voltage conversion circuit such as current-to-voltage converter 114, a data conversion circuit such as analog-to-digital converter (ADC) 116, and a control circuit such as bias point controller 118. Replica transistor 102' can refer to and be defined herein as a transistor having an identical physical properties or structure as input transistor 102 (e.g., transistors 102 and 102' have the same size/dimensions, the same channel type, the same threshold voltage, the same mobility, the same on state resistance, etc.). Replica transistor 102' can also alternatively be a scaled version of the transistor 102 (e.g., the size of replica transistor 102' can be a fraction of the size of transistor 102). Replica transistor 102' may have a gate terminal configured to receive a voltage Vgen from voltage generator 112, a source terminal coupled to ground power supply line 108 (sometimes referred to as a ground line or ground), and a drain terminal configured to draw or receive a drain current I from converter 114.

Voltage generator 112 may be configured to generate a voltage Vgen that is provided to the gate terminal of replica transistor 102'. Voltage Vgen is therefore sometimes referred to as a replica gate voltage. Replica gate voltage Vgen is an adjustable voltage. Based on the voltage level of Vgen, the amount of current I that flows through replica transistor 102' can change accordingly. Bias point selection circuitry 110 can obtain multiple current measurements by adjusting Vgen to different voltage levels. Current-to-voltage converter 114 can be configured to convert the amount of current I to a corresponding analog voltage value V. Analog-to-digital converter 116 can be configured to convert the analog voltage V output by current-to-voltage converter 114 to a corresponding digital output Dout.

Bias point controller 118 can analyze multiple Dout values when Vgen is adjusted to different voltage levels and can output control signals for adjusting voltage generator 112 so that voltage generator 112 can generate a voltage Vout that is used for biasing the gate terminal of input transistor 102. Bias point controller 118 is sometimes referred to generally as "control circuitry" and can be formed as part of circuitry 110 (as shown in FIG. 5), as part of processing circuitry 18 shown in FIG. 1, or as part of control circuitry 14. The final voltage Vout output from voltage generator 112 can correspond to a bias voltage that produces a Gm3 of zero. Bias point selection circuitry 110 configured and operated in this way can be technically advantageous and beneficial by improving the linearity of RF circuit 100 over process, voltage, and temperature (PVT) variations. As described above in connection with FIGS. 3-4, since the optimum bias voltage for OIP3 is much more sensitive to process variations than it is to temperature variations, bias point selection circuitry 110 can simply determine the optimal bias point one time during wafer testing operations to save power. This is exemplary. If desired, bias point selection circuitry 110 can optionally perform bias point calibration operations one or more times in the field to ascertain or update the optimum bias point for input transistor 102 as needed.

Figure 6A:
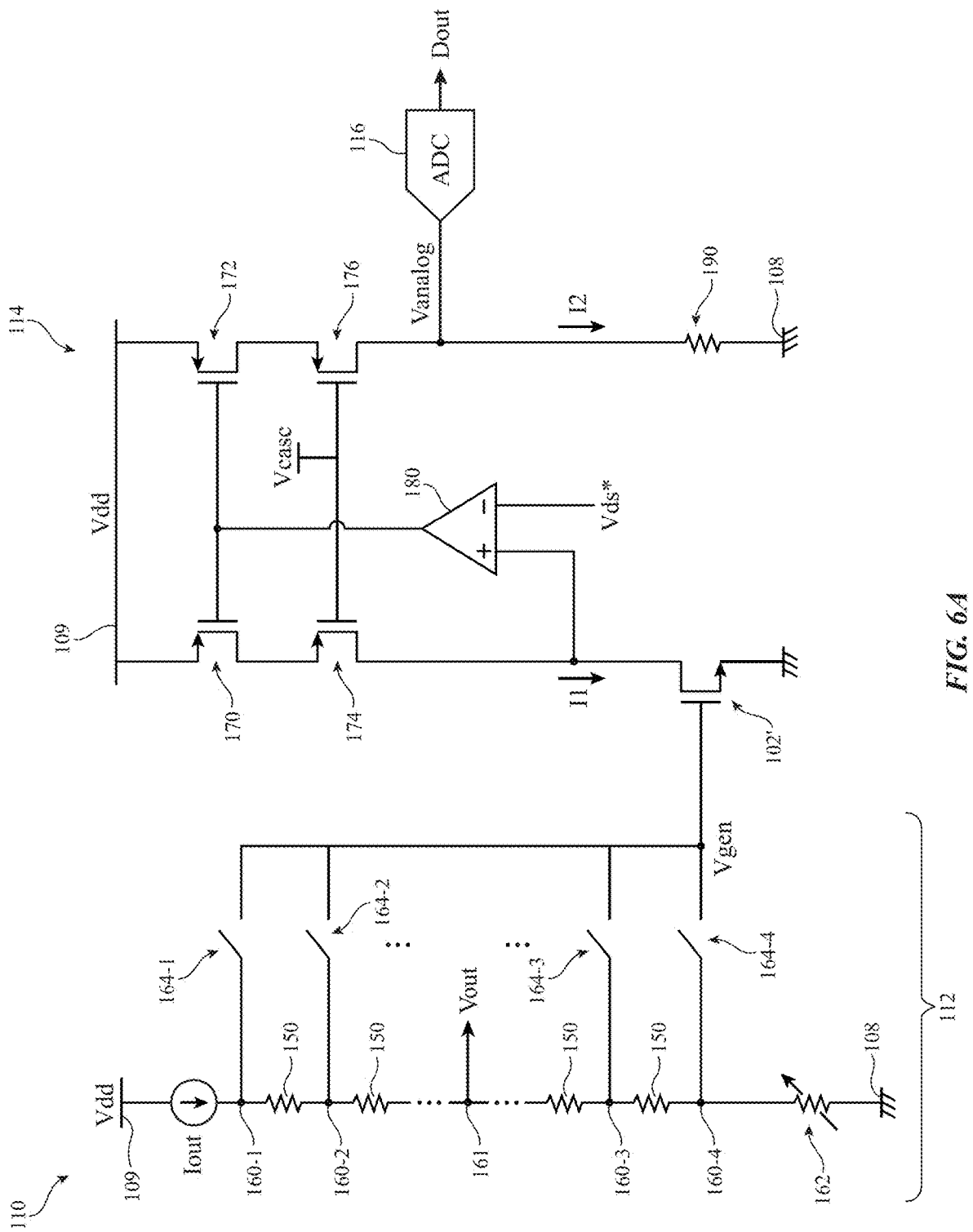
FIG. 6A is a circuit diagram showing one illustrative implementation of bias point selection circuitry of the type shown in FIG. 5 in accordance with some embodiments.

FIG. 6A is a circuit diagram showing one illustrative implementation of bias point selection circuitry 114 of the type described in connection with FIG. 5. As shown in FIG. 6A, voltage generator 112 can include a resistive chain having a current source Iout coupled to a positive power supply line 109 (e.g., a power supply terminal on which positive power supply voltage Vdd is provided), a chain of resistors 150 coupled in series, and a resistive digital-to-analog converter (DAC) 162. An output voltage Vout can be generated at node 161 along the resistive chain. Resistors 150, although all labeled with the same reference numeral, can have the same or different resistance values. A first number of resistors 150 can be coupled between node 161 and current source Iout. A second number of resistors 150 can be coupled between node 161 and resistive DAC 162. The first number of resistors 150 can be equal to the second number of resistors 150. If desired, the first number of resistors 150 can be different than the second number of resistors 150. Resistive DAC 162 can have an adjustable resistive value that is tuned using controller 118 (see FIG. 5).

Voltage generator 112 may include a plurality of switches 164. For example, a first switch 164-1 may be coupled between node 160-1 along the resistive chain and the gate terminal of replica transistor 102'; a second switch 164-2 may be coupled between node 160-2 along the resistive chain and the gate terminal of replica transistor 102'; a third switch 164-3 may be coupled between node 160-3 along the resistive chain and the gate terminal of replica transistor 102'; and a fourth switch 164-4 may be coupled between node 160-4 along the resistive chain and the gate terminal of replica transistor 102'. One of switches 164 can be selectively activated by controller 118 to output a corresponding voltage Vgen to the gate terminal of replica transistor 102'. Configured in this way, Vgen voltage values symmetrically greater than and less than Vout can be sequentially provided to the gate terminal of replica transistor 102' so that a suitable Vout voltage can be later interpolated. Voltage generator 112 of the type shown in FIG. 6A is merely illustrative. In general, other types of voltage generation circuit 112 can be employed to output different voltage levels to replica transistor 102'.

The term "activate" with respect to a switch (or transistor) may refer to or be defined herein as an action that places the switch in an on or low-impedance state such that the two terminals of the switch are electrically connected to conduct current. The term "deactivate" with respect to a switch (or transistor) may refer to or be defined herein as an action that places the switch in an off or high-impedance state such that the two terminals of the switch/transistor are electrically disconnected with minimal leakage current.

Current-to-voltage generator 114 can include p-type transistors such as p-type transistors 170, 172, 174, 176, a resistor 190, and an amplifier such as operational amplifier 180. As shown in FIG. 6A, transistors 170 and 174 may be coupled in series between the Vdd power supply line 109 and the drain terminal of replica transistor 102'. Transistors 172 and 176 and resistor 190 may be coupled in series between the Vdd power supply line 109 and ground line 108. Transistors 170 and 172 may have gate terminals that are shorted to each other. Configured in this way, transistors 170 and 172 may serve as current mirroring transistors of a current mirror circuit. Transistors 174 and 176 may have gate terminals that are shorted to each other and that receive a cascode bias voltage Vcasc. Configured in this way, transistors 174 and 176 serve as cascode transistors. The use of cascode transistors in a current mirror configuration can help increase the output impedance and provide improved current matching capability for the current mirror. The cascode transistors 174 and 176 are optional and can be omitted to save area.

Amplifier 180 can have a first (positive) input coupled to the drain terminal of replica transistor 102', a second (negative) input configured to receive a desired drain voltage Vds*, and an output terminal coupled to the gate terminals of current mirroring transistors 170 and 172. Voltage Vds* may represent the same voltage that is applied to the drain terminal of input transistor 102 in RF circuit 100 (see, e.g., FIG. 5). Arranged as such, a first current I1 can flow through transistors 170 and 174 into replica transistor 102' while a second (mirrored) current I2 can flow through transistor 172 and 176 into resistor 190 to generate a corresponding analog voltage Vanalog. Current I2 can be equal to or different than current I1, depending on the current mirror ratio of transistors 170 and 72. Regardless, voltage Vanalog generated by converter 114 will be proportional to the amount of current I1 flowing through replica transistor 102'. Current-to-voltage converter 114 of the type shown in FIG. 6A is merely illustrative. In general, other types of current-to-voltage converter 114 can be employed to convert current I1 flowing through replica transistor 102' to a corresponding voltage value. Analog-to-digital converter 116 can receive voltage Vanalog output from converter 114 and generate a corresponding digital code Dout. Any type of analog-to-digital converter 116 can be employed within bias point selection circuitry 100. Bias point selection circuitry 110 configured in this may be insensitive to the PMOS current mirror ratio, the ADC reference/offset voltage, and the threshold voltage of transistors 102 and 102'.

In the example of FIG. 6A, replica transistor 102' is an n-type transistor, assuming that the corresponding input transistor 102 of RF circuit 100 is also an n-type transistor. This is illustrative. If input transistor 102 were a p-type transistor, then replica transistor 102' can alternatively be a p-type transistor and the polarities of the transistors within current-to-voltage converter 114 can be flipped.

Figure 6C:
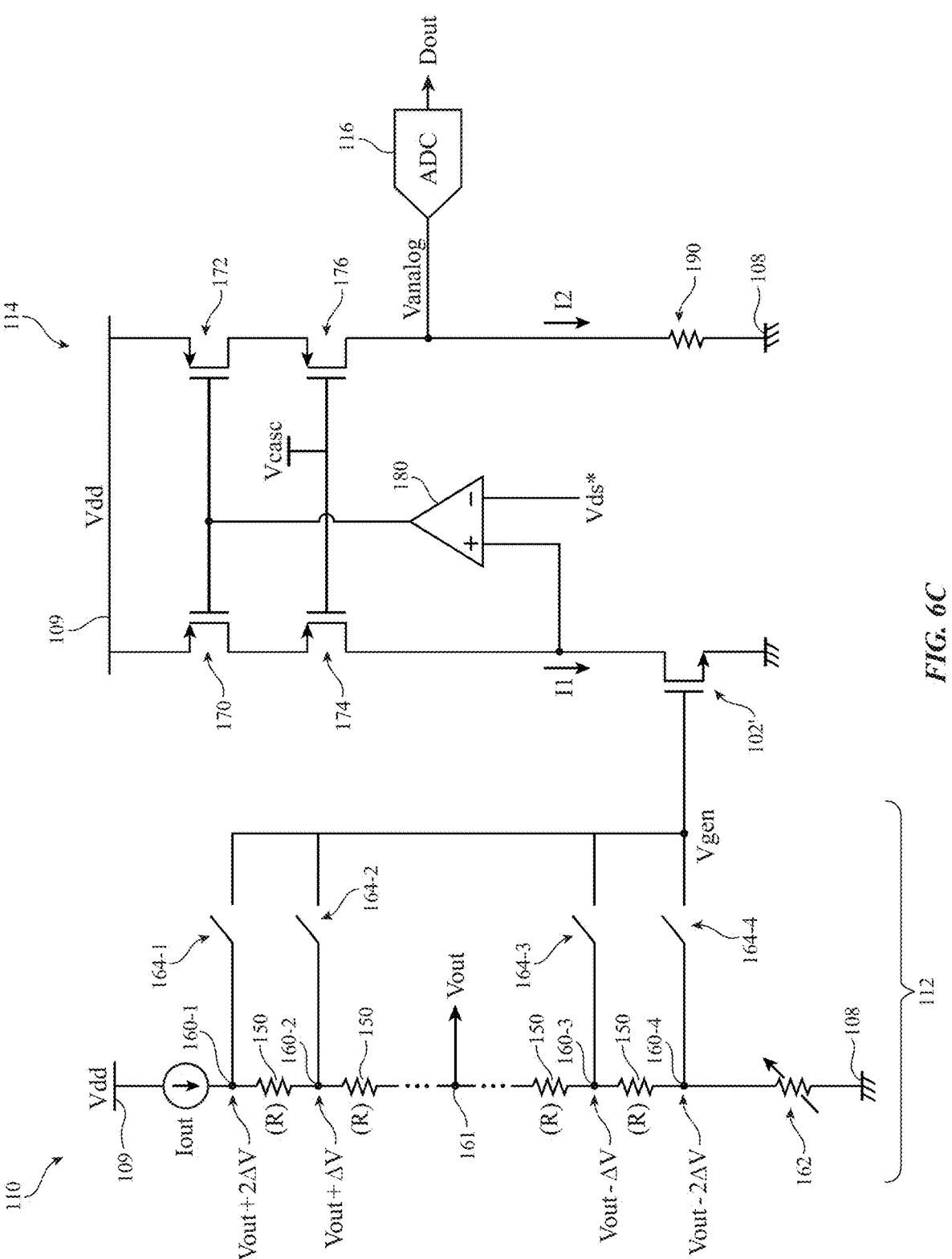
FIG. 6C is a circuit diagram of illustrative bias point selection circuitry configured to perform 2:1 interpolation in accordance with some embodiments.
Figure 6D:
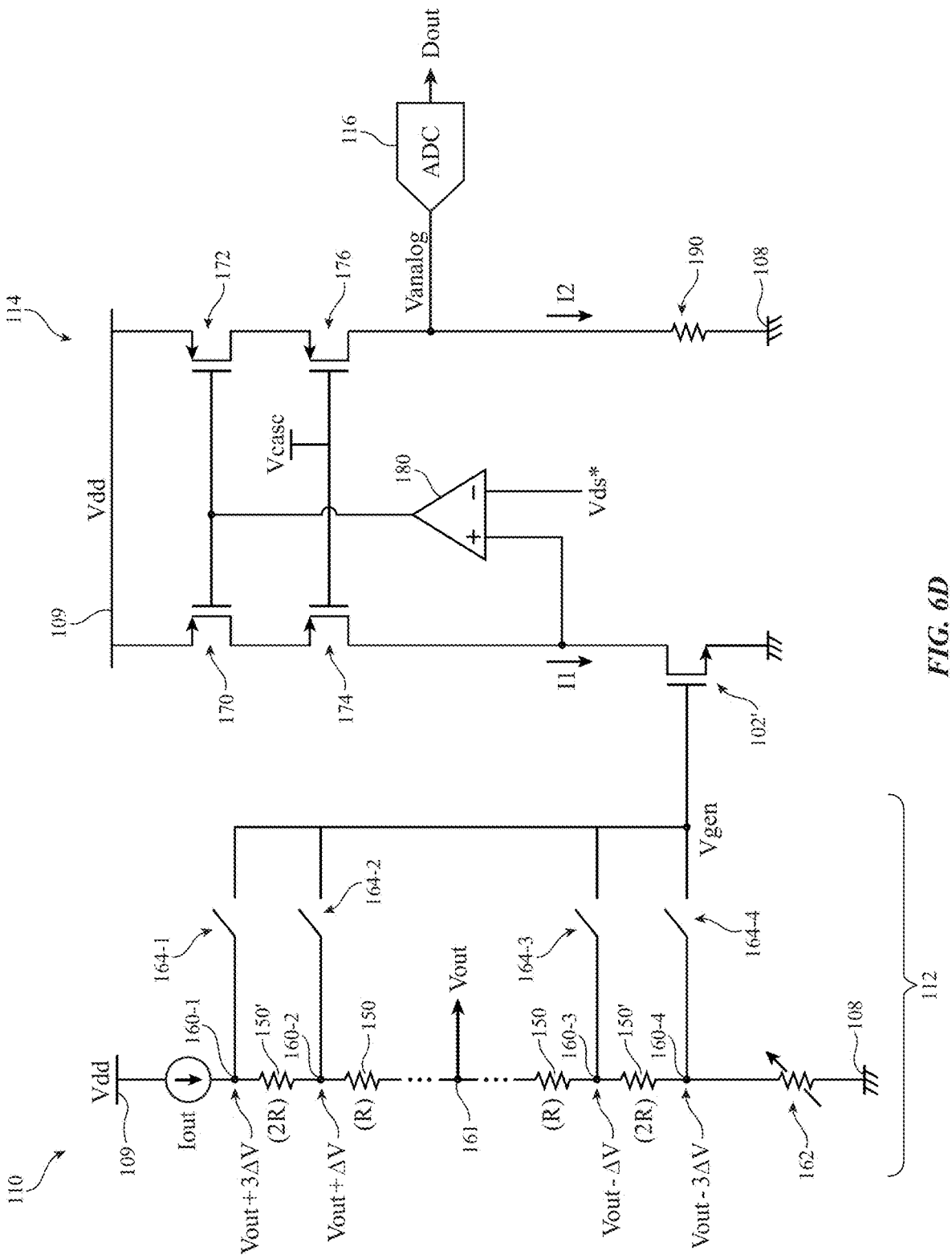
FIG. 6D is a circuit diagram of illustrative bias point selection circuitry configured to perform 3:1 interpolation in accordance with some embodiments.
Figure 7:
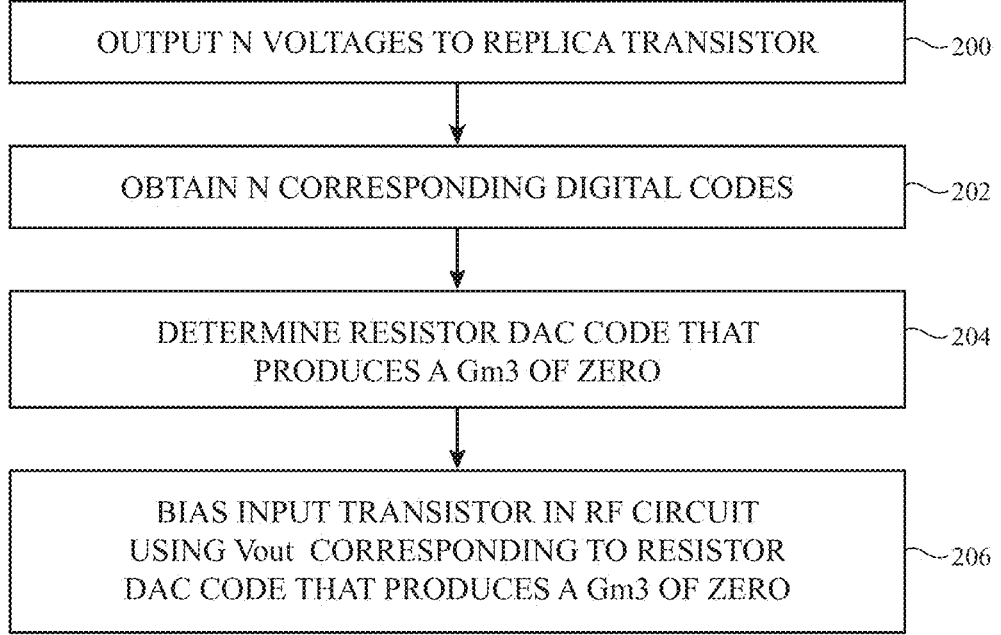
FIG. 7 is a flow chart of illustrative steps for operating bias point selection circuitry of the type shown in FIGS. 5 and 6 in accordance with some embodiments.

FIG. 7 is a flow chart of illustrative steps for operating bias point selection circuitry 110 of the type shown in FIGS. 5 and 6. During the operations of block 200, voltage generator 112 can be configured to output, sequentially, N different voltages to replica transistor 200. For example, in the embodiment of FIG. 6A, switch 164-1 can be activated during a first time period so that a first Vgen level is provided at the gate terminal of replica transistor 102'. During a second time period following the first time period, switch 164-2 can be activated so that a second Vgen level is provided at the gate terminal of replica transistor 102'. During a third time period following the second time period, switch 164-3 can be activated so that a third Vgen level is provided at the gate terminal of replica transistor 102'. During a fourth time period following the third time period, switch 164-4 can be activated so that a third Vgen level is provided at the gate terminal of replica transistor 102'. This example in which N=4 is illustrative. In general to find the zero crossing of Gm3, N can be any positive integer greater than or equal to 4. The N voltages should represent different voltages symmetrically taken about the center node 161.

FIG. 6B is a table showing illustrative Gm3 interpolation/ polynomials with N=4. A first row 500 of the table shows coefficients for 2:1 interpolation. The second row 502 of the table shows coefficients for 3:1 interpolation. The third row 504 of the table shows coefficients for 3:2 interpolation for approximating Gm3. If desired, other types of interpolation schemes can be employed (e.g., 4:3 interpolation, 4:1 interpolation, etc.). To approximate Gm3, at least four current measurements are needed. With at least four data points symmetrically taken about Vout, any error would be proportional to $\Delta V^2$. In general, points taken closer to the center point Vout will result in a better approximation.

The N voltages can generate N different current measurements flowing through replica transistor 102', which produce N corresponding digital codes output from ADC 116 (see operations of block 202). The N digital codes can be received at bias point controller 118. During the operations of block 204, bias point controller 118 can be configured to analyze the N digital codes to determine a resistor DAC code (e.g., a code for adjusting DAC 162 or otherwise adjusting voltage generator 112) that produces a Gm3 of zero.

For instance, in an example wherein 4 ADC codes are obtained and a 2:1 interpolation scheme is used, bias point controller 118 can be configured to identity a resistor DAC code where $$Dout1 - 2*Dout2 + 2*Dout3 - Dout4 = 0 \qquad (1)$$

In equation 1, Dout1 may represent the ADC digital output code corresponding to Vgen of (Vout+2*$\Delta$V); Dout2 may represent the ADC digital output code corresponding to Vgen of (Vout+$\Delta$V); Dout3 may represent the ADC digital output code corresponding to Vgen of (Vout−$\Delta$V); and Dout4 may represent the ADC digital output code corresponding to Vgen of (Vout−2*$\Delta$V).

FIG. 6C is a circuit diagram of illustrative bias point selection circuitry 110 configured to perform 2:1 interpolation. As shown in FIG. 6C, four series resistors 150 all having the same resistance (see identical resistance "R") can be used in voltage generator 112 such that a voltage of (Vout+2*$\Delta$V) is generated at node 160-1, a voltage of (Vout+$\Delta$V) is generated at node 160-2, a voltage of (Vout−$\Delta$V) is generated at node 160-3, and a voltage of (Vout−2*$\Delta$V) is generated at node 160-4. This configuration corresponds to a Gm3 expression as follows:

$$Gm3 \approx \frac{Iout*(Vout+2\Delta V) - 2*Iout(Vout+\Delta V) + 2*Iout(Vout-\Delta V) - Iout(Vout-2\Delta V))}{2\Delta V^3} \qquad (2)$$

The coefficients of the four measurements in equation 2 may correspond to those shown in row 500 in the table of FIG. 6B.

As another example where 4 ADC codes are obtained and a 3:1 interpolation scheme is used, bias point controller 118 can be configured to identity a resistor DAC code where $$Dout1 - 3*Dout2 + 3*Dout3 - Dout4 = 0 \qquad (3)$$

In equation 3, Dout1 may represent the ADC digital output code corresponding to Vgen of (Vout+3*$\Delta$V); Dout2 may represent the ADC digital output code corresponding to Vgen of (Vout+$\Delta$V); Dout3 may represent the ADC digital output code corresponding to Vgen of (Vout−$\Delta$V); and Dout4 may represent the ADC digital output code corresponding to Vgen of (Vout−3*ΔV). The amount of ΔV can depend on the value of each resistor 150 and can be selected to minimize the error in the Gm3 prediction.

FIG. 6D is a circuit diagram of illustrative bias point selection circuitry 110 configured to perform 3:1 interpolation. As shown in FIG. 6D, series resistors 150 and 150' can be used in voltage generator 112 such that a voltage of (Vout+3*ΔV) is generated at node 160-1, a voltage of (Vout+ΔV) is generated at node 160-2, a voltage of (Vout−ΔV) is generated at node 160-3, and a voltage of (Vout−3*ΔV) is generated at node 160-4. Resistors 150' can have twice the resistance of resistors 150 (see, e.g., resistors 150 have resistances "R" whereas resistors 150' have resistance "2R"). This configuration corresponds to a Gm3 expression as follows:

$$Gm3 \approx \frac{Iout*(Vout + 3\Delta V) - 3*Iout(Vout + \Delta V) + 3*Iout(Vout - \Delta V) - Iout(Vout - 3\Delta V)}{3\Delta V^3} \quad (4)$$

The coefficients of the four measurements in equation 4 may correspond to those shown in row 502 in the table of FIG. 6B.

As yet another example, a 3:2 interpolation scheme based on 4 ADC codes can be used in which bias point controller 118 can be configured to identity a resistor DAC code where $$2*Dout1 - 3*Dout2 + 3*Dout3 - 2*Dout4 = 0 \quad (5)$$

In equation 3, Dout1 may represent the ADC digital output code corresponding to Vgen of (Vout+3*ΔV); Dout2 may represent the ADC digital output code corresponding to Vgen of (Vout+2*ΔV); Dout3 may represent the ADC digital output code corresponding to Vgen of (Vout−2*ΔV); and Dout4 may represent the ADC digital output code corresponding to Vgen of (Vout−3*ΔV). These examples are illustrative. In general, any interpolation scheme based on N symmetrical digital codes can be employed. If desired, similar processes can be used to estimate zero crossover points for a $2^{nd}$ order transconductance Gm2, a $4^{th}$ order transconductance Gm4, or other device operating characteristics impacting the overall linearity of an RF circuit. To estimate the zero crossing of an Nth derivative of current, least N+1 points are needed.

During the operations of block 206, the main input transistor 102 in RF circuit 100 may be biased using a Vout level produced by the resistor DAC code identified during the operations of block 204 to produce a Gm3 of zero. Bias point selection circuitry 110 operating in this way is therefore sometimes referred to as Gm3 crossover point estimation circuitry.

The operations of FIG. 7 are merely illustrative. The operations of FIG. 7, sometimes referred to as bias point calibration operations, can be performed once at a manufacturing facility, one or more times during a wafer testing phase, and/or can be performed in the field after being shipped to customers. In some embodiments, one or more of the described operations may be modified, replaced, or omitted. In some embodiments, one or more of the described operations may be performed in parallel. In some embodiments, additional processes may be added or inserted between the described operations. If desired, the order of certain operations may be reversed or altered and/or the timing of the described operations may be adjusted so that they occur at slightly different times. In some embodiments, the described operations may be distributed in a larger system.

Figure 8:
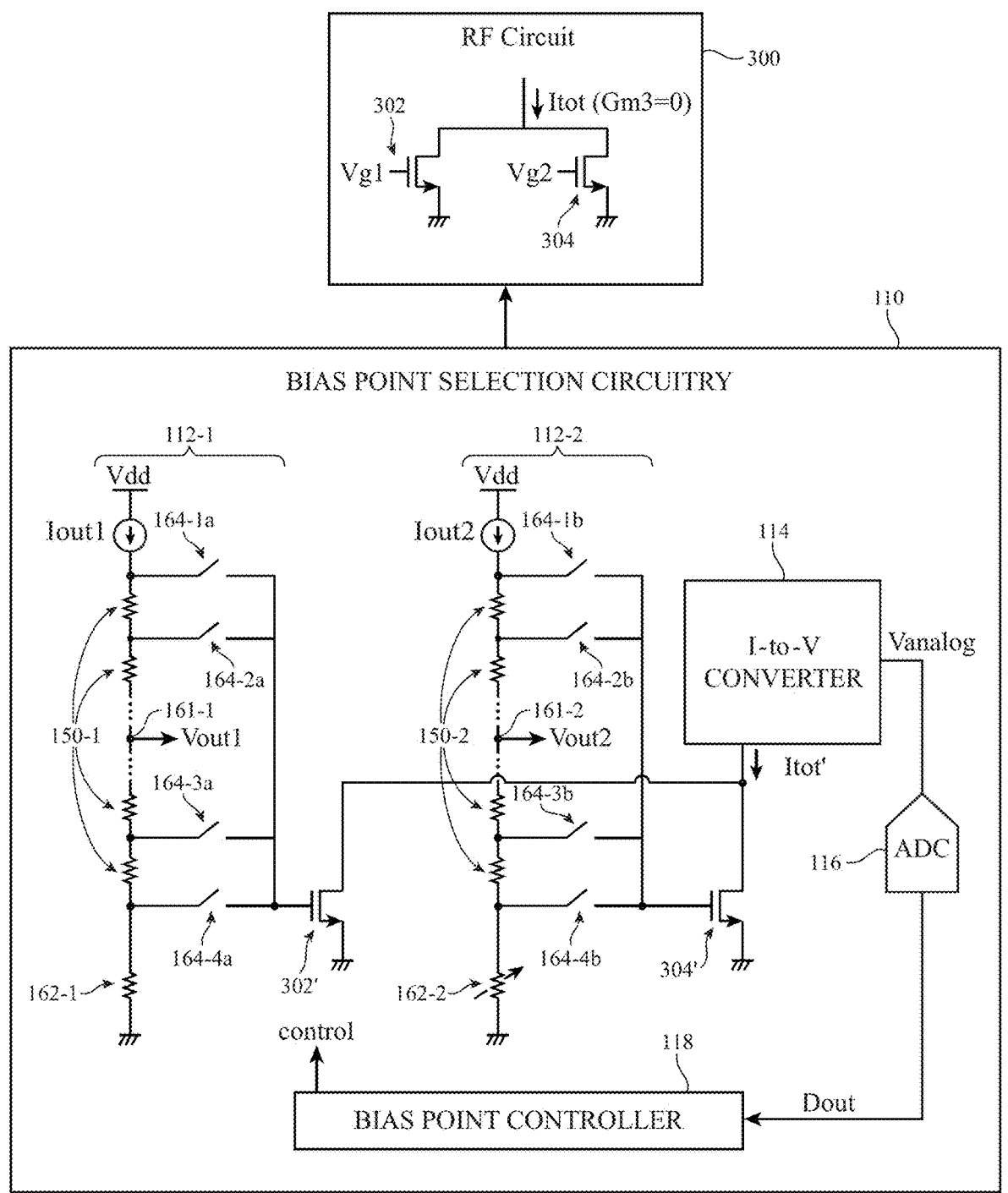
FIG. 8 is a circuit diagram of illustrative bias point selection circuitry configured to determine an optimum bias voltage for a multipath amplifier in accordance with some embodiments.

Bias point selection circuitry 110 of the type described in connection with FIGS. 5 and 6 for identifying an optimum bias point corresponding to a Gm3 of zero for a single input transistor 102 is exemplary. FIG. 8 shows another embodiment of bias point selection circuitry 100 configured to determine an optimal bias point for an RF circuit 300 having multiple input paths. Radio-frequency circuit 300 can represent a radio-frequency amplifier, variable gain amplifier, mixer, phase-locked loop, radio-frequency switches, radio-frequency filter, impedance matching network, voltage-controlled oscillator, voltage-controlled attenuator, frequency divider, a component in transceiver circuitry 28 (see FIG. 2), a component in front end module 40, and/or other electronic components in the transmit or receive path of wireless circuitry 24. As shown in FIG. 8, radio-frequency circuit 300 can include, among other transistors, a first input path having a main transistor such as first input transistor 302 and a second input path having an auxiliary transistor such as second input transistor 304. The combined current Itot flowing through transistors 302 and 304 may govern the overall linearity performance of circuit 300. In an example where RF circuit 300 is a radio-frequency amplifier, first input transistor 302 may represent part of a class A or class AB amplifier path, whereas second input transistor 304 may represent part of a class C amplifier path. This is exemplary.

Input transistor 302 may have a gate terminal configured to receive a first bias voltage Vg1. Input transistor 304 may have a gate terminal configured to receive a second bias voltage Vg2. Bias point selection circuitry 110 may be configured to output an optimum bias voltage for input transistor 304 of radio-frequency circuit 304 such that the Gm3 of the combined amplifier paths is equal to zero. Bias point selection circuitry 100 of FIG. 8 can include a first voltage generator 112-1 for outputting an adjustable voltage to first replica transistor 302', a second voltage generator 112-2 for outputting an adjustable voltage to second replica transistor 304', a current-to-voltage converter 114, an ADC 116, and a bias point controller 118.

Replica transistor 302' can refer to and be defined herein as a transistor having an identical physical structure as first input transistor 302 (e.g., transistors 302 and 302' have the same size/dimensions, the same channel type, the same threshold voltage, the same mobility, the same on state resistance, etc.). Replica transistor 302' can also be a scaled version of the transistor 302 (e.g., the size of replica transistor 302' can be a fraction of the size of the transistor 302). Replica transistor 302' may have a gate terminal configured to receive a voltage output from voltage generator 112-1, a source terminal coupled to a ground line, and a drain terminal.

Replica transistor 304' can refer to and be defined herein as a transistor having an identical physical structure as second input transistor 304 (e.g., transistors 304 and 304' have the same size/dimensions, the same channel type, the same threshold voltage, the same mobility, the same on state resistance, etc.). Replica transistor 304' can also be a scaled version of the transistor 304 (e.g., the size of replica transistor 304' can be a fraction of the size of the transistor 304). Replica transistor 304' may have a gate terminal configured to receive a voltage output from voltage generator 112-2, a source terminal coupled to a ground line, and a drain terminal that is coupled to the drain terminal of replica transistor 302'.

Voltage generator 112-1 can include a resistive chain having a current source Iout1 coupled to a Vdd power supply line, a chain of resistors 150-1 coupled in series, and a first resistive digital-to-analog converter (DAC) 162-1. A first output voltage Vout1 can be generated at center node 161-1 along the resistive chain. Resistive DAC 162-1 can have a fixed resistive value that is configured to produce a Vout1 equal to the bias voltage Vg1 of first input transistor 302. Voltage generator 112-1 may include a first plurality of switches. For example, a first switch 164-1a may be coupled between a first node along the resistive chain and the gate terminal of replica transistor 302'; a second switch 164-2a may be coupled between a second node along the resistive chain and the gate terminal of replica transistor 302'; a third switch 164-3a may be coupled between a third node along the resistive chain and the gate terminal of replica transistor 302'; and a fourth switch 164-4a may be coupled between a fourth node along the resistive chain and the gate terminal of replica transistor 302'.

Similarly, voltage generator 112-2 can include an additional resistive chain having a current source Iout2 coupled to the Vdd power supply line, a chain of resistors 150-2 coupled in series, and a second resistive digital-to-analog converter (DAC) 162-2. A first output voltage Vout2 can be generated at center node 161-2 along the resistive chain. Resistive DAC 162-2 can have an adjustable resistive value that is tuned using controller 118. Voltage generator 112-2 may include a second plurality of switches 164. For example, a first switch 164-1b may be coupled between a first node along the additional resistive chain and the gate terminal of replica transistor 304'; a second switch 164-2b may be coupled between a second node along the additional resistive chain and the gate terminal of replica transistor 304'; a third switch 164-3b may be coupled between a third node along the additional resistive chain and the gate terminal of replica transistor 304'; and a fourth switch 164-4b may be coupled between a fourth node along the additional resistive chain and the gate terminal of replica transistor 304'. Voltage generators 112-1 and 112-2 of the type shown in FIG. 8 are exemplary. In general, any type of voltage generation circuit can be employed.

The drain terminals of replica transistors 302' and 304' can be shorted together such that a combined current level Itot' is sensed by current-to-voltage converter 114. Current-to-voltage converter 114 can be implemented using a current-mirror-based approach as shown in the example of FIGS. 6A, 6C, and 6D or can employ other signal conversion architectures. Converter 114 can convert Itot' to a corresponding analog voltage Vanalog, which can then be converted to a corresponding digital code Dout using ADC 116. Bias point controller 118 can analyze multiple Dout values when voltage generators 112-1 and 112-2 output different values and can output control signals for adjusting at least voltage generator 112-2 so that voltage generator 112-2 can generate a voltage Vout2 that is used for biasing the gate terminal of input transistor 304. The final voltage Vout2 output from voltage generator 112-2 can correspond to a bias voltage that produces a Gm3 of zero for the combined current path.

Bias point selection circuitry of FIG. 8 can be operated using a similar process outlined in FIG. 7. For example, during the operations of block 200, switches 164-1a and 164-1b can be simultaneously activated during a first time period so that corresponding first and second voltage levels are provided to the gate terminals of replica transistors 302' and 304', respectively. During a second time period following the first time period, switches 164-2a and 164-2b can be simultaneously activated so that corresponding third and fourth voltage levels are provided to the gate terminals of replica transistors 302' and 304', respectively. During a third time period following the second time period, switches 164-3a and 164-3b can be simultaneously activated so that corresponding fifth and sixth voltage levels are provided to the gate terminals of replica transistors 302' and 304', respectively. During a fourth time period following the third time period, switches 164-4a and 164-4b can be simultaneously activated so that corresponding seventh and eighth voltage levels are provided to the gate terminals of replica transistors 302' and 304', respectively.

This example in which N is equal to 4 is illustrative. In general, N can represent any positive integer greater than or equal to 4. The N voltages should represent different voltages symmetrically taken about the center nodes 161-1 and 161-2. In general, any type of interpolation scheme can be used to estimate the Gm3 crossover point (see, e.g., equations 1-3). The remaining steps associated with the operations of blocks 202, 204, and 206 need not be reiterated in detail to avoid obscuring the present embodiment.

Figure 9:
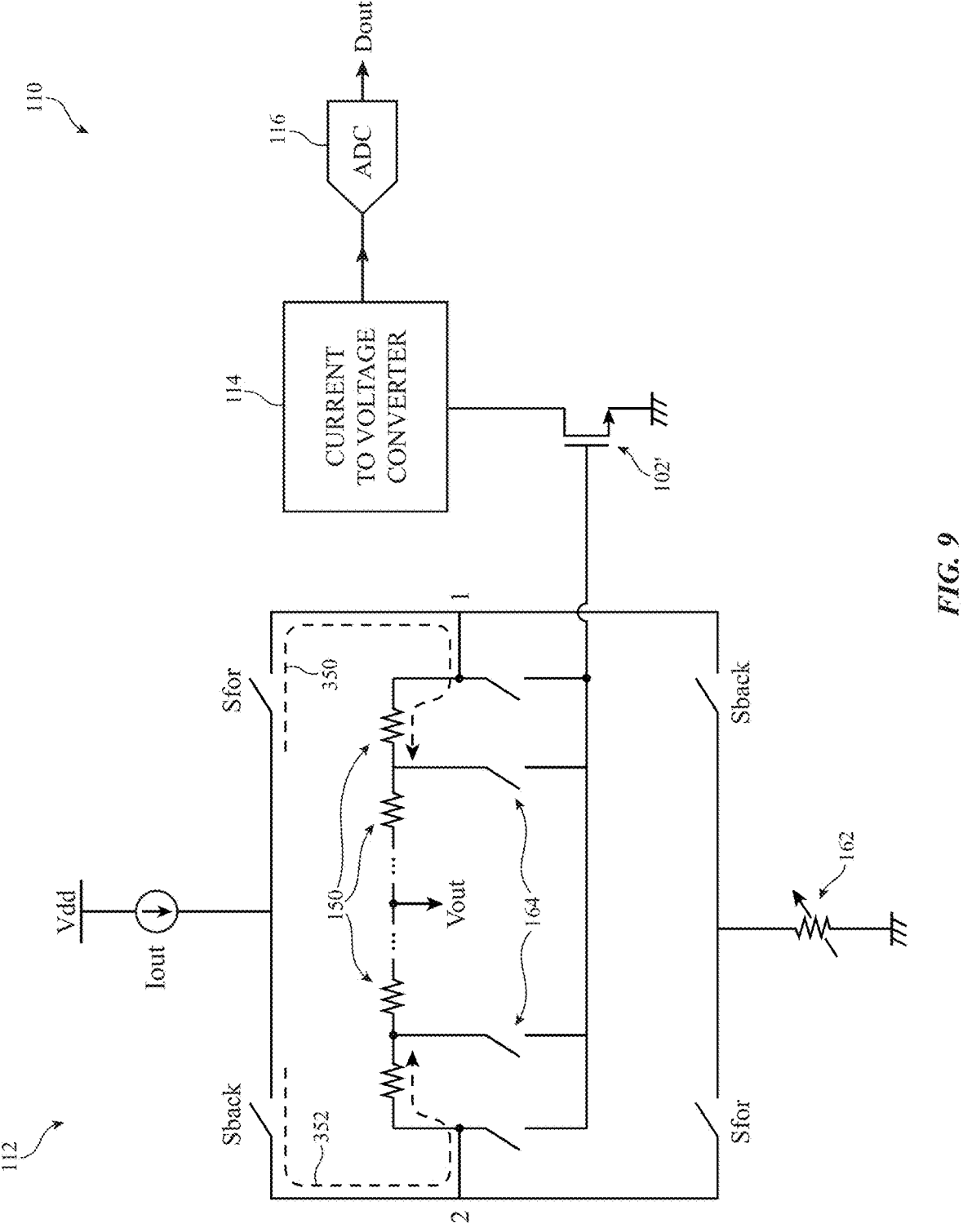
FIG. 9 is a circuit diagram of illustrative bias point selection circuitry configured to obtain forward and backward (reverse) measurements for reducing sensitivity to resistor mismatch in accordance with some embodiments.

The embodiment of at least FIG. 6A in which current in voltage generator 112 flows in one direction (e.g., downwards from Vdd to ground in the orientation shown) is exemplary. Any mismatch in the value of resistors 150 can, however, introduce error in the current density prediction at which Gm3 is equal to zero. FIG. 9 is a circuit diagram showing another embodiment of bias point selection circuitry 110 configured to obtain forward and backward (reverse) current measurements for reducing sensitivity to resistor mismatch.

As shown in FIG. 9, voltage generator 112 can include a resistive chain having a current source Iout coupled to the Vdd positive power supply line 109, a chain of resistors 150 coupled in series, and an adjustable resistive DAC 162. An output voltage Vout can be generated at a center node along the resistive chain. Voltage generator 112 may include a plurality of switches 164 for selectively coupling one of the nodes along the resistive chain to the gate terminal of replica transistor 102'.

Voltage generator 112 can further include first and second forward switches Sfor and first and second backward (reverse) switches Sback that are controlled using bias point controller 118. The first forward switch Sfor may be coupled between Iout and a first end of the resistive chain, whereas the second forward switch Sfor may be coupled between a second end of the resistive chain and adjustable DAC 162. The first backward switch Sback may be coupled between Iout and the second end of the resistive chain, whereas the first backward switch Sback may be coupled between the second end of the resistive chain and adjustable DAC 162. When the forward switches Sfor are activated, current can flow through the resistive chain in a first direction 350. When the backward switches Sback are activated, current can flow through the resistive chain in a second direction 352 that is reversed relative to the first direction 350.

Figure 10:
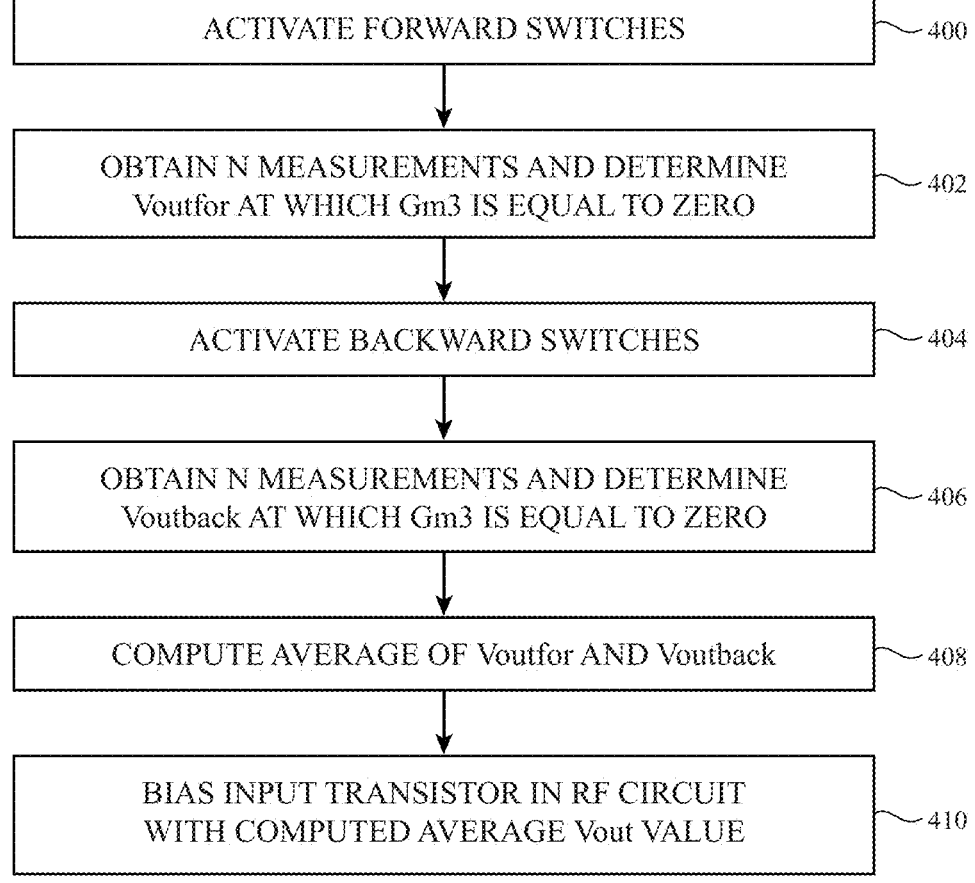
FIG. 10 is a flow chart of illustrative steps for operating bias point selection circuitry of the type shown in FIG. 9 in accordance with some embodiments.

FIG. 10 is a flow chart of illustrative steps for operating bias point selection circuitry 110 of the type shown in FIG. 9. During the operations of block 400, the forward switches Sfor can be activated. During the operations of block 402 while the forward switches are activated, bias point selection circuitry 110 can obtain N forward current measurements through replica transistor 102', which can be converted to digital codes using circuits 114 and 116 and then analyzed by bias point controller 118 to determine Voutfor at which Gm3 is equal to zero. Further explanation of such optimal Vout determination is described in connection with blocks 200-206 of FIG. 7.

During the operations of block 404, the backward/reverse switches Sback can be activated (while deactivating the forward switches Sfor). During the operations of block 406 while the backward switches are activated, bias point selection circuitry 110 can obtain N reverse current measurements through replica transistor 102', which can be converted to digital codes using circuits 114 and 116 and then analyzed by bias point controller 118 to determine Voutback at which Gm3 is equal to zero. Further explanation of such optimal Vout determination is described in connection with blocks 200-206 of FIG. 7. The example of FIG. 10 in which the operations of block 404 and 406 are performed after the operations of block 400 and 402 are merely illustrative. If desired, the operations of block 404 and 406 can be performed before the operations of block 400 and 402 such that the reverse current measurements are obtained before the forward current measurements.

During the operations of block 408, bias point controller 118 may compute an average of Voutfor and Voutback. During the operations of block 410, the input transistor 102 of RF circuit 100 can then be biased using the average Vout value computed from block 406 to produce a Gm3 of zero. Computing an average Vout value based on forward and reverse current measurements in this way can be technically advantageous and beneficial to reduce the sensitivity of voltage generator 112 to resistor mismatch in the resistive chain.

The operations of FIG. 10 are merely illustrative. The operations of FIG. 10, sometimes referred to as bias point calibration operations, can be performed once at a manufacturing facility, one or more times during a wafer testing phase, and/or can be performed in the field after being shipped to customers. In some embodiments, one or more of the described operations may be modified, replaced, or omitted. In some embodiments, one or more of the described operations may be performed in parallel. In some embodiments, additional processes may be added or inserted between the described operations. If desired, the order of certain operations may be reversed or altered and/or the timing of the described operations may be adjusted so that they occur at slightly different times. In some embodiments, the described operations may be distributed in a larger system.

The methods and operations described above in connection with FIGS. 1-10 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Wireless circuitry comprising:
a radio-frequency circuit having an input transistor; and
bias point selection circuitry configured to output a bias voltage for biasing a gate terminal of the input transistor, the bias point selection circuitry including
a replica transistor that is a replica of the input transistor,
a voltage generator configured to output one or more voltage levels to a gate terminal of the replica transistor, and
a current-to-voltage converter coupled to a source-drain terminal of the replica transistor.

2. The wireless circuitry of claim 1, wherein the bias point selection circuitry further comprises:
an analog-to-digital converter configured to receive analog voltages from the current-to-voltage converter and to output corresponding digital codes based on the received analog voltages.

3. The wireless circuitry of claim 2, further comprising:
control circuitry configured to receive the digital codes from the analog-to-digital converter and to adjust the voltage generator to output the bias voltage based on the digital codes.

4. The wireless circuitry of claim 3, wherein the control circuitry is configured to determine the bias voltage by performing interpolation operations on the digital codes.

5. The wireless circuitry of claim 3, wherein the voltage generator is further configured to sequentially output at least four different voltages to the gate terminal of the replica transistor.

6. The wireless circuitry of claim 3, wherein the voltage generator comprises:
a current source;
a chain of resistors coupled in series with the current source; and
a resistive digital-to-analog converter (DAC) coupled in series with the current source and tuned by the control circuitry.

7. The wireless circuitry of claim 6, wherein the voltage generator further comprises:
a first switch coupled between a first node along the chain of resistors and the gate terminal of the replica transistor;
a second switch coupled between a second node, different than the first node, along the chain of resistors and the gate terminal of the replica transistor;
a third switch coupled between a third node, different than the first and second nodes, along the chain of resistors and the gate terminal of the replica transistor; and
a fourth switch coupled between a fourth node, different than the first, second, and third nodes, along the chain of resistors and the gate terminal of the replica transistor.

8. The wireless circuitry of claim 7, wherein the voltage generator further comprises:

first switches that are selectively activated to allow current to flow through the chain of resistors in a first direction; and second switches that are selectively activated to allow current to flow through the chain of resistors in a second direction opposite the first direction.

9. The wireless circuitry of claim 3, wherein the current-to-voltage converter comprises:

a current mirror circuit configured to receive a first current flowing through the replica transistor and to output a second current;

a resistor configured to receive the second current and to generate an analog voltage; and an amplifier having a first input coupled to the source-drain terminal of the replica transistor, a second input configured to receive a source-drain voltage of the input transistor, and an output coupled to gate terminals of the current mirror circuit.

10. The wireless circuitry of claim 1, wherein the radio-frequency circuit further comprises an additional input transistor, and the bias point selection circuitry further comprises:

an additional replica transistor that is a replica of the additional input transistor and having a source-drain terminal coupled to the current-to-voltage converter; and an additional voltage generator configured to output one or more voltage levels to a gate terminal of the additional replica transistor.

11. A method of determining a bias voltage for an input transistor in wireless circuitry, the method comprising:

with a voltage generator, sequentially outputting a plurality of different voltages to a replica transistor that is a replica of the input transistor;

with a current-to-voltage converter, converting different current levels flowing through the replica transistor when the plurality of different voltages are provided to the replica transistor into corresponding analog voltages;

with an analog-to-digital converter, converting the analog voltages into corresponding digital codes; and determining a setting for the voltage generator based on a third order transconductance of the replica transistor.

12. The method of claim 11, further comprising:

performing interpolation operations on the digital codes to determine the bias voltage.

13. The method of claim 11, wherein the third order transconductance is equal to zero for the replica transistor.

14. The method of claim 13, further comprising:

obtaining a first number of measurements while current flowing through the voltage generator is in a first direction; and obtaining a second number of measurements while current flowing through the voltage generator is in a second direction opposite to the first direction.

15. The method of claim 14, further comprising:

determining a first output voltage that produces the third order transconductance of zero for the replica transistor based on the first number of measurements;

determining a second output voltage that produces the third order transconductance of zero for the replica transistor based on the second number of measurements; and computing an average of the first and second output voltages.

16. Circuitry comprising:

a radio-frequency circuit having an input transistor; and bias voltage determination circuitry configured to determine a bias voltage for the input transistor that produces a third order transconductance of zero for the input transistor, the bias voltage determination circuitry including a replica transistor having identical physical properties as the input transistor, a voltage generator coupled to a gate terminal of the replica transistor, and a current-to-voltage converter coupled to a source-drain terminal of the replica transistor.

17. The circuitry of claim 16, wherein the radio-frequency circuit comprises a circuit selected from the group consisting of: a radio-frequency amplifier, a variable gain amplifier, and a mixer.

18. The circuitry of claim 16, wherein the bias voltage determination circuitry further comprises:

an analog-to-digital converter configured to receive analog voltages from the current-to-voltage converter and to generate corresponding digital codes.

19. The circuitry of claim 18, wherein the bias voltage determination circuitry further comprises:

a bias point control circuit configured to receive the digital codes from the analog-to-digital converter and to identify a setting for the voltage generator that produces the bias voltage for the input transistor by performing interpolation operations on the digital codes.

20. The circuitry of claim 16, wherein the voltage generator comprises:

a first pair of switches that are selectively activated to allow current to flow through the voltage generator in a first direction; and a second pair of switches that are selectively activated to allow current to flow through the voltage generator in a second direction that is reversed with respect to the first direction.

* * * * *